United States Patent [19]

Morikawa et al.

[11]  4,223,292
[45]  Sep. 16, 1980

[54] HALL ELEMENT

[75] Inventors: Juichi Morikawa, Katsuta; Nobuo Kotera, Kokubunji, both of Japan

[73] Assignee: Hitachi, Ltd., Japan

[21] Appl. No.: 927,392

[22] Filed: Jul. 24, 1978

[30] Foreign Application Priority Data

Jul. 25, 1977 [JP] Japan .............................. 52-98358[U]

[51] Int. Cl.² .......................................... H01L 43/04
[52] U.S. Cl. ................................ 338/32 H; 323/94 H;
324/251; 357/27
[58] Field of Search .................... 338/32 H; 323/94 H;
324/251; 357/27

[56] References Cited

U.S. PATENT DOCUMENTS 2,914,728  11/1959  Brophy et al. ..................... 338/32 H
3,265,959   8/1966  Wiehl et al. ....................... 338/32 H
3,373,391   3/1968  Bohm et al. ....................... 338/32 H Primary Examiner—C. L. Albritton
Attorney, Agent, or Firm—Craig & Antonelli

[57] ABSTRACT

A basically cross-shaped semiconductor Hall element comprises a pair of current-supplying electrodes as well as a pair of Hall electrodes. The structure includes trapezoidal semiconductor regions extending from the central magneto-sensitive region in both the current-supplying electrode directions to thereby suppress the element temperature rise due to Joule heating. In addition, the contiguous slant edges of the extended trapezoidal portion form an angle $\theta$ greater than 90° with lateral edges of the central rectangular magneto-sensitive region to thereby suppress the semiconductor noise dependent on the shape itself.

9 Claims, 4 Drawing Figures

HALL ELEMENT

BACKGROUND OF THE INVENTION

1. Field of the Invention

The present invention relates to an improvement of a Hall element in respect of heat dissipation and noise characteristic without deteriorating the bias current versus Hall voltage characteristic.

2. Description of the Prior Art

The formula for expressing the fundamental characteristic of a Hall element having a substantially criss-cross geometrical configuration includes a Hall coefficient which provides a constraint to the material to be used for the Hall element. In general, use of a high purity semiconductor material is most preferred. Because such material exhibits a relatively high resistance, generation of Joule heat is necessarily involved due to the voltage drop corresponding to a product of the resistance of the Hall element and the bias current $I_H$ thereof. Thus, when the Hall element is operated under relatively severe conditions, temperature rise of the Hall element ascribable to the Joule heat thereof will result in a reduction of the Hall coefficient $R_H$ and hence, a correspondingly reduced Hall voltage $V_H$.

In the measurement of a weak magnetic field or magnetic flux in a small area in which the use of Hall element is increasingly demanded, it is necessary to decrease the length l of a magneto-sensitive portion of the Hall element 2 of a substantially criss-cross configuration such as shown in FIG. 1 and hence to decrease correspondingly the width w of the magneto-sensitive portion, which results in the corresponding decrease in the detected magnetic flux $\phi$. In this connection, the term "magnetosensitive portions" is intended to mean a rectangular portion of a Hall element which serves positively for generation of a Hall voltage in response to magnetic flux of a magnetic field to be detected or measured. In an effort to enhance the sensitivity of the Hall element, it has been hitherto known that the bias current $I_H$ is increased to thereby increase the output voltage or a ferromagnetic material having a low magnetic reluctance is employed with the magnetic flux being concentrated on the magneto-sensitive portion whereby the density of magnetic flux in appearance in the magneto-sensitive portion is increased to attain a high Hall voltage or a high output voltage. However, miniaturization of the magneto-sensitive portion as well as the increased bias current $I_H$ in turn incur degradation in the heat dissipation property for Joule heat generated in the Hall element, necessarily giving rise to a temperature rise in the Hall element which tends to lower the Hall voltage. In view of the circumstances, there is a need for a more effective heat dissipation technique to enhance the Hall voltage $V_H$.

As an approach to solve the above problem, the Japanese Utility Model Application Kokai (Laid-Open) No. 49-107962 discloses a particular geometrical configuration of a Hall element directed to an improved heat dissipation efficiency, which is herein cited for reference. FIG. 1 illustrates dimensional relationship defining the geometrical configuration of a Hall element according to the prior proposal. Referring to this figure, input terminal electrodes 5 and 5' for supplying a bias current are provided at both ends of a slab (main body) 2 of a Hall element by depositing electrically conductive metal in the form of a laminated layer. A pair of contiguous projection 6 and 6' are integrally formed at both lateral sides of the slab 2 in opposition to each other. The projecting arms 6 and 6' are formed with output terminal electrodes 4 and 4' for detecting a Hall voltage, respectively, by depositing an electrically conductive metal layer onto the exposed end faces thereof. In such a Hall element, the proper proposal teaches that the heat generation in the Hall element can be suppressed at minimum when the following dimensional relationships are realized:

$$\left. \begin{array}{l} 1.0 \leq (l_1 + l_2)/w \leq 4.0 \\ 0.2 \leq (-l_1 + l_2)/s \leq 0.9 \\ 0.5 \leq s/w \leq 0.8 \end{array} \right\}$$

where
w: the width of the slab 2,
s: the width of the integral arm 6, 6',
$l_1$: the projecting length of the arm 6, 6' and
$l_2$: the distance between a lateral edge of the arm (6, 6') and the adjacent input terminal electrode (5, 5').

However, the attempt to suppress the heat generation in connection with an increased output voltage (i.e., Hall voltage) of the Hall element is not the positive measure. Even the Hall element realized with the above dimensional requirements fulfilled has proven to be still unsatisfactory for obtaining a desired high Hall voltage, as described hereinafter. Besides, it has been found that noise characteristics of the Hall element attributable more or less to the geometrical configuration thereof which are mentioned and considered neither in the above-referenced prior art nor any other literatures must be improved.

SUMMARY OF THE INVENTION

A main object of the invention is therefore to provide a Hall element which avoids the drawbacks of the hitherto known structure described above and is capable of generating a high Hall voltage with greatly improved heat dissipation and noise characteristics without exerting influence to its bias current versus Hall voltage characteristics.

In view of the above and other objects which will become more apparent as the description proceeds, there is proposed according to an aspect of the invention a Hall element which comprises a magneto-sensitive portion of a semiconductor material disposed substantially perpendicularly to the direction of a magnetic flux density, a pair of first regions for carrying a bias current extending contiguously from the magneto-sensitive portion, a pair of Hall voltage detecting regions extending to form a cross-like configuration with the first regions around the magneto-sensitive portion, and metallic electrodes connected electrically to the contiguous regions for both the bias current-carrying and the voltage detecting regions, wherein the following dimensional conditions are fulfilled:

$$L > l > s$$

$$W > w, \text{ and}$$

$$\pi > \theta > \pi/2$$

where
l = length of the magneto-sensitive portion in the direction along the bias current flow,
w = width of the magneto-sensitive portion in the direction perpendicular to that of the bias current, s = width of the second regions over which each of the second regions is contiguous to the magneto-sensitive portion, θ = angle formed between a lateral edge of the magneto-sensitive portion and a peripheral edge of an enlarged region provided contiguously to the magento-sensitive portion at both ends thereof, L = overall length of the Hall element in the direction of the bias current minus lengths of the input electrodes, and W = width of the enlarged region in the direction perpendicular to the bias current flow.

DETAILED DESCRIPTION OF THE PREFERRED EMBODIMENTS

Figure 1:
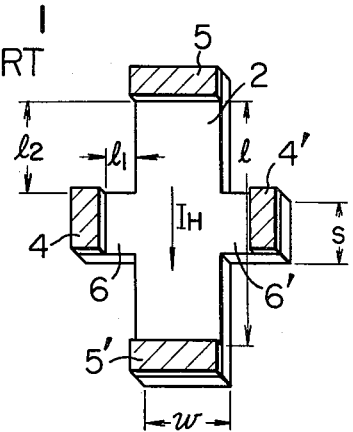
FIG. 1 is a plan view to illustrate dimensional relations of a prior art Hall element having a particular geometrical configuration to maximize Hall voltage without considering substantial temperature rise of the Hall element.

Before making the description of the exemplary embodiments of the invention, the results of experimental studies carried out by the inventors will be briefly stated for better understanding of the invention.

Since it is believed that the generation of Joule heat is inevitable in a body (hereinafter referred to as magneto-sensitive portion) of a Hall element made of a semiconductor material so far as a high bias current $I_H$ is necessarily required for obtaining a high Hall volage, approach is made as to the measure how to dissipate effectively the generated heat.

When the dimensional rato l/w which is determinative for the geometrical configuration or the form of the magneto-sensitive portion is selected greater than 3 or 4, then the configuration or the geometrical factor $f_H$ will become approximately equal to 1. As a result, the Hall voltage $V_H$ of the Hall element will be independent of the above dimensional ratio. Thus, the Hall element may be miniaturized to a desired degree so long as the above dimensional ratio is maintained. An additional member which serves for the heat dissipation is provided and imparted with a heat dissipation area as large as possible. With such an arrangement, the bias current density will be increased in the magneto-sensitive portion or region, while the bias current density will be decreased in the section of a large area serving for the heat dissipation. Further, the Joule heat generated in the magneto-sensitive portion will be conducted to the regions of a large area contiguous to the former, whereby effective heat dissipation will take place at the large area section to thereby eventually prevent the Hall element from being subjected to a high temperature rise. On the above assumption, the accompanying noise characteristics are examined.

The results of the experiments have proven that the above assumption is valid in practice and makes it possible to accomplish an enhanced Hall voltage characteristic as well as improved noise characteristics which are impossible with the prior art Hall element.

Now, this invention will be described in more detail by referring to the drawings.

Figure 2:
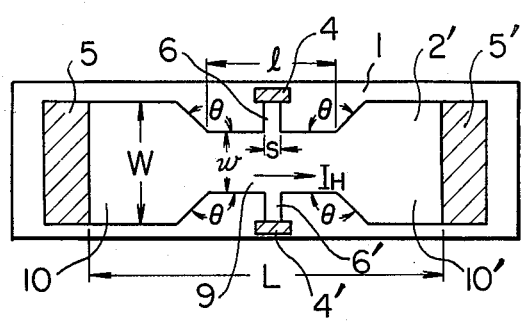
FIG. 2 is a schematic top plan view of a Hall element having a substantially cross-like configuration for illustrating dimensional relations to enhance the heat dissipation effect according to an embodiment of this invention.
Figure 3:
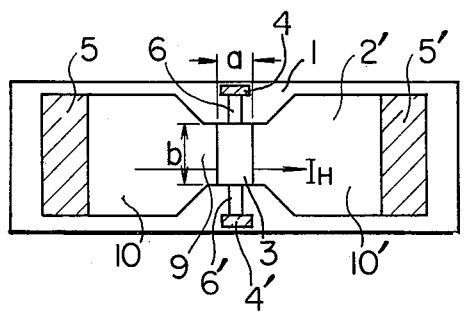
FIG. 3 is a schematic top plan view of a Hall element of a substantially cross-like configuration and having a magneto-sensitive portion provided thereon with a flux concentrator ferrite according to another embodiment of this invention.

FIGS. 2 and 3 each shows a top plan view of the configuration of the Hall element according to the embodiment of the invention. Here, FIG. 3 illustrates a modification of the embodiment of FIG. 2.

In the structure of the Hall element as shown, a layer 2' of a semiconductor thin film is provided on a ferrite substrate 1 in a configuration as geometrically and dimensionally defined hereunder, with a pattern which is generally similar to a butterfly shape. The semiconductor thin layer 2' of the butterfly-shaped pattern comprises a magneto-sensitive region 9 at its narrowed center portion, a pair of wing-like regions 10 and 10' for carrying a bias current or control current and a pair of regions or projections 6 and 6' resembling a head portion and a tail portion of the butterfly serving to detect a Hall voltage in magnetic field. The regions 10 and 10' and the projections 6 and 6' extend from the magneto-sensitive region 9 in a substantially criss-cross configuration. The pair of regions 10 and 10' expand to adjacent bias current supplying electrodes 5 and 5', respectively. Each of bias current-carrying regions 10 and 10' has a configuration consisting of a trapezoidal portion and a rectangular portion connected to the longer one of the parallel sides of the trapezoidal portion.

The projections 6 and 6' extending from the edges of the narrowed portion 9 of the layer 2' are connected at their ends to Hall voltage detecting electrodes 4 and 4' which are provided on the substrate 1. The shape of the regions 6 and 6' may be expanded.

Then, the process of fabricating a Hall element of a substantially criss-cross configuration according to the invention will be outlined. A ferrite substrate 1 having a very smooth surface is prepared and a thin semiconductor film of an indium-antimonide (InSb) intermetallic compound is formed by a well-known three temperature evaporation method with high purity source materials being used for In and Sb. Subsequently, well-known, microzonemelting, lapping and photo-etching techniques are employed. Thus, finally, a thin film layer 2' of Hall element is formed in a pattern of a substantially criss-cross configuration with a thickness of 1.4 μm. In FIG. 2, reference letters indicate dimensions used for defining the characteristic feature of the Hall element according to the invention, as described hereinbefore. Noise characteristic of the element is examined with the angle denoted by θ in FIG. 2 being selected to be equal to 90°, 110°, 120°, 135° and 160°, respectively. The noise level of 1 μV is standardized for −120 dBV. When θ = 135°, the noise level is −125 dBV which is apparently improved over the noise level −123 dBV obtained when θ = 90°. The improvement of the noise characteristic in the range of intermediate angles between 90° and 135° is enhanced substantially as a linear function of increment in angle. In the following table, typical embodiments of the Hall elements having geometrical dimensions in the ranges defined by the teachings of the invention are listed with θ being selected equal to 135°, where the dimensions are given in a unit of mm. In this table, a and b denote, respectively, the width and length of a flux concentrator 3 made of soft ferrite for concentrating the magnetic flux which is disposed on a limited portion of the magneto-sensitive section, as shown in FIG. 3. Dimensions s, L, W, l, and w are defined in FIG. 2 and also apply to the embodiment shown in FIG. 3. The example labeled "Reference" is of the prior art Hall element such as shown in FIG. 1 and serves for comparison with the embodiments according to the invention.

Typical Dimensions of Exemplary Hall Elements

| Example No. | s | L | W | l | w | a | b | w/W |
|---|---|---|---|---|---|---|---|---|
| 1 | 0.05 | 0.8 | 0.4 | 0.5 | 0.3 | 0.05 | 0.3 | 0.8 |
| 2 | 0.05 | 0.8 | 0.4 | 0.5 | 0.2 | 0.05 | 0.2 | 0.5 |
| 3 | 0.05 | 0.8 | 0.4 | 0.3 | 0.3 | 0.05 | 0.3 | 0.8 |
| 4 | 0.05 | 0.8 | 0.4 | 0.3 | 0.2 | 0.05 | 0.2 | 0.5 |
| 5 | 0.05 | 0.8 | 0.4 | 0.05 | 0.2 | 0.05 | 0.2 | 0.5 |
| 6 | 0.05 | 0.8 | 0.6 | 0.3 | 0.2 | 0.15 | 0.26 | 0.3 |
| Reference | 0.05 | 0.8 | 0.4 | 0.8 | 0.4 | 0.05 | 0.4 | 1 |

Figure 4:
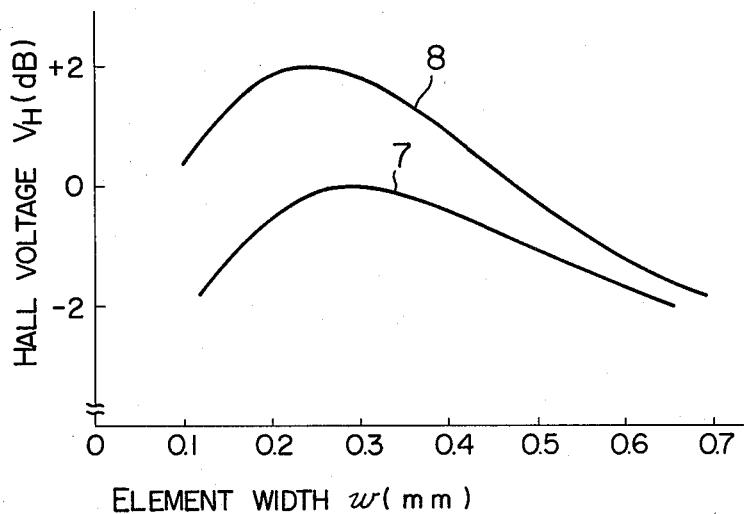
FIG. 4 graphically illustrates measured characteristics of the Hall element shown in FIG. 3 to show enhanced sensitivity attainable according to this invention.

In addition to the Hall elements listed in the above table, many other Hall elements of different dimensions have been fabricated and Hall voltages $V_H$ have been measured in unit of dB as a function of the width of the magnetosensitive section w under the condition that $I_H = 10$ mA (constant bias current) and $L = 0.8$ mm (constant element length), the results of which are graphically illustrated in FIG. 4. Generally when W is increased and L is fixed, the l/w and accordingly, the geometrical factor $f_H$ decreases to give small Hall voltages. In addition, the present inventors find that Hall voltage also decreases when w is decreased because of the element temperature rise under the constantcurrent condition. The curve 7 is for the case where w/W = 1 (prior art), while the curve 8 represents the characteristic obtained with w/W selected approximately equal to 0.3. From the examination of the experimental results, it has been found that a Hall element exhibiting effective heat dissipation property as well as improved noise characteristic can be obtained when the following dimensional relations are attained:

(1) $L > l > s$ for $l$, (2) $W > w$ for $W$ and (3) $\pi > \theta > \pi/2$ for $\theta$ Referring again to FIG. 4, the curve 8 represents the characteristic for the highest Hall voltage attained in the Hall element according to the invention. The other characteristic curves in the cases where $1 > w/W > 0.3$ or $0 > w/W > 0.3$ correspond to those displaced downwardly in parallel to the curve 8 and lying above the curve 7 which is of the Hall element of the prior art structure where w/W = 1, although these curves are not shown in FIG. 4. In any case, so far as the dimensional requirements defined above are fulfilled, the Hall voltage characteristic is improved over the one represented by the curve 7.

As will be appreciated from the foregoing discussion, the present invention provides a Hall element having an excellent heat dissipation efficiency and improved noise characteristic which has dependence on the geometrical configuration or form of the Hall element. Since such advantages can be attained without modifying specifically the width s of the Hall-voltage detecting portion, the longitudinal length l and width w of the magneto-sensitive section, the element can be implemented as a low impedance element with the driving power source being of a small capacity which nevertheless permits a high bias current $I_H$ to be used, whereby ultimately the Hall output voltage can be increased. The Hall elements according to the invention find many applications including applications to audio Hall effect magnetic heads.

We claim:

1. A Hall element of a generally criss-cross shape comprising a substrate, a pair of current-supplying electrodes, a pair of Hall voltage detecting electrodes, and a current-carrying layer formed of a semiconductor thin film on the substrate in a pattern of a butterfly-like shape, said butterfly-shaped pattern of the semiconductor thin film layer comprising a narrowed central portion having long sides parallel to a control-current path and short sides perpendicular to the long sides and constituting a magneto-sensitive portion of the Hall element, a pair of wing-like regions integrally contiguous to the entire short sides of said central portion for carrying a control current, each of said wing-like regions being of a trapezoidal area, its short and long parallel edges being connected to the short side of the central portion and the current-supplying electrode, respectively, slant edges of the trapezoidal area forming an angle greater than 90 degrees and smaller than 180 degrees with the long sides of the central portion, to thereby provide heat sink for allowing a large amount of control current and suppress semiconductor noise generated in the element depending on the shape of the semiconductor layer, and a head-like region and a tail-like region extending from the long sides of said central portion perpendicularly thereto and connected to said pair of Hall-voltage detecting electrodes, respectively.

2. The Hall element according to claim 1, in which said pattern of the semiconductor thin film is symmetrical with respect to the central axis of said current-carrying regions.

3. The Hall element according to claim 1, further comprising means disposed on said magneto-sensitive region for concentrating magnetic flux.

4. A Hall element of large control current and high output capability comprising a magneto-sensitive portion of a semiconductor material adapted to be disposed substantially perpendicularly to the direction of a magnetic flux to be sensed, said magneto-sensitive portion being of a rectangular area having long edges substantially parallel to control current path and short edges;

a pair of first regions formed of the semiconductor material adjacent the respective short edges of said magneto-sensitive portion for carrying a control current, each first region having an enlarged area capable of heat dissipation for supply of a relatively large control current in immediate vicinity of the magneto-sensitive portion; and a pair of second regions formed of the semiconductor material integrally with the magneto-sensitive portion and for detecting a Hall voltage, said second regions being positioned to form a cross-like configuration around said magneto-sensitive portion together with said first regions; and metal electrodes electrically connected to said first and second regions for control current supply and Hall-voltage output, respectively, wherein said magneto-sensitive portion and said first and second regions have the following dimensional relations:

$$L > l > s$$

$$W > w, \text{ and}$$

$$\pi > \theta > \pi/2$$

l = length of said magneto-sensitive portion in the direction of the control current path i.e., the length of the long edge,
w = width of said magneto-sensitive portion in the direction perpendicular to that of said control current, i.e., the length of the short edge,
s = width of said second regions over which each of said second regions is contiguous to said magneto-sensitive portion,
$\theta$ = angle formed between the long edge of said magneto-sensitive portion and a peripheral edge of the enlarged area of the first region contiguous to said long edge of magneto-sensitive portion,
L = overall length of said Hall element in the direction of said control current path minus length of control current electrodes along said path, and
W = width of the first region in the direction perpendicular to the control current path.

5. The Hall element according to claim 4 in which said dimensions l and W satisfy the following relations:

$$\tfrac{1}{2} L \leq l > s$$

$$0.5 W \geq w \geq 0.1 W$$

6. The Hall element according to claim 4 in which said dimension $\theta$ satisfies the following relation:
$$140° \leq \theta \leq 120°$$

7. The Hall element according to claim 1, 2, 3, 4, 5, or 6, in which said dimension w satisfies the following relation:

$$w = 0.3 W$$

8. The Hall element according to claim 1 in which said dimensions l and W satisfy the following relations:

$$\tfrac{1}{2} L \leq l > s$$

$$0.5 W \geq w \geq 0.1 W$$

9. The Hall element according to claim 1 in which said dimension $\theta$ satisfies the following relation:
$$140° \leq \theta \leq 120°$$

* * * * *